United States Patent [19]
Krivokapic

[11] Patent Number: 5,824,587
[45] Date of Patent: Oct. 20, 1998

[54] METHOD FOR MAKING CONVEX DEVICE WITH ELEVATED GATE STRUCTURE

[75] Inventor: Zoran Krivokapic, Santa Clara, Calif.

[73] Assignee: Advanced Micro Devices, Inc., Sunnyvale, Calif.

[21] Appl. No.: 920,966

[22] Filed: Aug. 29, 1997

Related U.S. Application Data

[63] Continuation-in-part of Ser. No. 890,063, Jul. 9, 1997.

[51] Int. Cl.[6] .................................................. H01L 21/338
[52] U.S. Cl. ............................................................... 438/300
[58] Field of Search ...................................... 438/300, 183

[56] References Cited

U.S. PATENT DOCUMENTS

| | | | |
|---|---|---|---|
| 4,532,004 | 7/1985 | Akiyama et al. | 438/183 |
| 5,571,738 | 11/1996 | Krivokapic | 437/44 |
| 5,652,157 | 7/1997 | Hirano et al. | 438/183 |

*Primary Examiner*—Charles L. Bowers, Jr.
*Assistant Examiner*—Craig Thompson
*Attorney, Agent, or Firm*—Fliesler, Dubb, Meyer & Lovejoy, LLP

[57] ABSTRACT

A method is provided for forming a transistor on a substrate. In constructing the transistor, an insulative layer of material is formed on the substrate, and a gate template structure is formed on top of the insulative layer of material. The gate template structure has a length that is substantially equal to a length of a narrowest point of a gate structure for the transistor and resides over a region of the substrate which will be overlaid by the gate structure. Next, a field oxide is grown from the insulative layer of material to extend outward from the gate template structure and upward from the insulative layer of material. The gate template structure is removed to form a gate structure cavity that extends through the field oxide and is defined by cavity sidewalls and a base. In the gate structure cavity, a gate structure is masklessly formed. After the gate structure is completed, ions are introduced into the substrate to form the source and drain for the transistor.

35 Claims, 9 Drawing Sheets

METHOD FOR MAKING CONVEX DEVICE WITH ELEVATED GATE STRUCTURE

CROSS-REFERENCE TO RELATED APPLICATIONS

This application is a continuation-in-part of and hereby incorporates by reference a U.S. patent application, entitled CONVEX DEVICE WITH SELECTIVELY DOPED CHANNEL, filed on Jul. 9, 1997, Ser. No. 08/890,063, by Zoran Krivokapic.

BACKGROUND OF THE INVENTION

1. Field of the Invention

The present invention is directed toward the field of manufacturing integrated circuits.

2. Description of the Related Art

Photolithography is employed during the manufacture of an integrated circuit to pattern layers of material within the integrated circuit. However, the time required for performing a photolithography process step on all of the integrated circuits being formed on a wafer is very significant in comparison to the time required for performing other operations to the entire wafer. Further, the number of defective integrated circuits on a wafer increases as the number of photolithography operations is increased.

The increased manufacturing time and defect rate that a wafer suffers as a result of photolithography results in the cost of each integrated circuit on the wafer being increased. By reducing the number of photolithography operations that are performed in the manufacture of an integrated circuit, the time and cost of producing the integrated circuit can be reduced.

Traditionally, photolithography has been used to form transistor gates in integrated circuits. FIGS. 1(a)–1(g) illustrate a cross-sectional view of a traditional process for forming a transistor. FIG. 1(a) shows a silicon substrate 101 which is overlaid by a thin layer of gate oxide 103 and a thicker layer of field oxide 102 which extends from the boundary of the gate oxide 103. The gate oxide 103 extends across a substantially planar portion of the substrate 101 in which the entire transistor will be formed.

As shown in FIG. 1(b), a layer of polysilicon 104 is deposited over the upper surface of the gate oxide 103 and field oxide 102. The polysilicon 104 is then patterned using photolithography to form a gate for the transistor. As part of the photolithography process, a layer of photoresist 105 is deposited on the upper surface of the polysilicon 104, as shown in FIG. 1(c). Next, a photomask is employed to pattern the photoresist 105, so that only a portion of the photoresist 105 remains on the polysilicon 104. FIG. 1(d) shows the remaining portion of the photoresist 105 covering a section of the polysilicon 104. The section of the polysilicon 104 that is covered by the remaining photoresist 105 will become the gate for a transistor. In order to form the gate, an etch is performed as part of the photolithography process. The etch, as shown in FIG. 1(e), results in all of the polysilicon 104 that is not covered by the photoresist 105 being removed. The remaining polysilicon 104 is the gate for the transistor. Once the etch is completed, the remaining photoresist 105 is removed to expose the gate 106 (FIG. 1(f)).

The formation of the transistor is completed by introducing ions through the gate oxide 103 into regions of the substrate 101 extending between the gate 106 and the field oxide 102. The resulting transistor 100 is shown in FIG. 1(g) to have a source 107 and a drain 108 formed in the substrate 101. The source 107 and drain 108 each extend between the gate 106 and the field oxide 102 beneath a substantially planar surface of the substrate 101.

In order to reduce the cost and time required for manufacturing integrated circuits that include transistors, it is desirable to form transistor gates without the use of photolithography. As described above, the elimination of photolithography steps provides for the reduction of both manufacturing time and defects, so that the cost of manufacturing integrated circuits including transistors can be lowered.

SUMMARY OF THE INVENTION

In accordance with the present invention, a transistor is formed on a wafer without the use of photolithography to pattern a gate in a layer of material on the wafer. In constructing a transistor in accordance with the present invention, a layer of insulative material is formed on a substrate, and a gate template structure is formed on top of the insulative material.

The gate template structure resides over a region of the substrate which will be overlaid by a gate structure for the transistor. The length of the gate template structure is substantially equal to the narrowest length of the transistor's gate structure. A field oxide is grown from the insulative layer of material to extend outward from the gate template structure and upward from said insulative layer of material.

Once the field oxide is formed, the gate template structure is removed to expose a gate structure cavity. The gate structure cavity extends through the field oxide and is defined by cavity sidewalls and a base, which is a mask window portion of the insulative layer of material.

A gate structure is then masklessly formed in the gate structure cavity. When forming the gate structure, a gate oxide is created by etching a portion of the mask window to expose a portion of the substrate and growing a gate oxide from the exposed portion of the substrate. After the gate oxide is formed, a layer of conductive material is deposited on an upper surface of the field oxide and in the gate structure cavity. The layer of conductive material is then polished, so that the conductive material is removed from the upper surface of the field oxide. The conductive material remaining in the gate structure cavity is the transistor's gate.

In embodiments of the present invention, the gate structure may also include a spacer, which extends from the gate structure cavity's sidewalls to separate the gate from the sidewalls. Prior to forming the gate, a spacer may be constructed by first depositing a spacer material on the upper surface of the field oxide and on the outer surface of the gate structure cavity. Next, the spacer material is masklessly etched to form the spacer.

Once the gate structure is formed, a source and drain are constructed for the transistor. In order to form the source and drain, the field oxide is masklessly etched to expose a first upper surface overlying a first region of the substrate and a second upper surface overlying a second region of the substrate. Next, a layer of epitaxial silicon is grown on the first upper surface and the second upper surface.

After the epitaxial silicon is grown, a set of ions are introduced into the first region of the substrate and the second region of the substrate. As a result, a source is formed in the first region of the substrate, and a drain is formed in the second region of the substrate.

BRIEF DESCRIPTION OF THE DRAWINGS

Further details of the present invention are explained with the help of the attached drawings in which.

DETAILED DESCRIPTION OF THE PREFERRED EMBODIMENTS

Figure 2A:
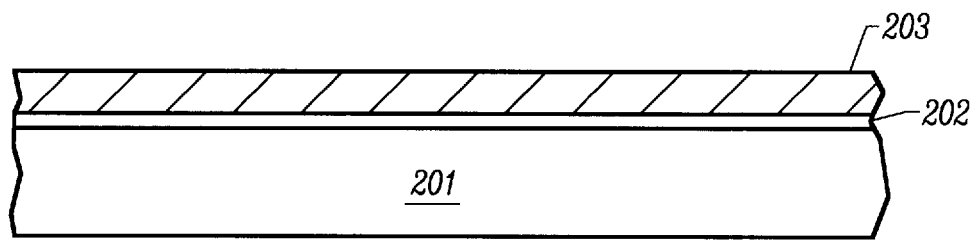
FIGS. 2(a)–2(p) illustrate a cross-sectional view of a process for forming a transistor in accordance with the present invention.
Figure 2B:
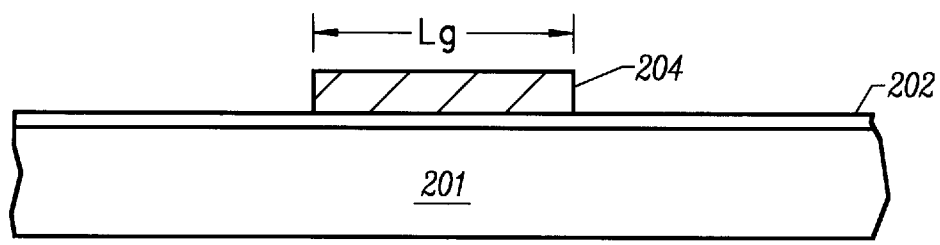
Figure 2C:
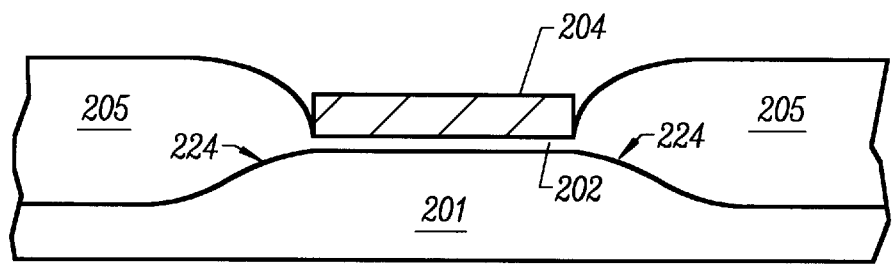
Figure 2D:
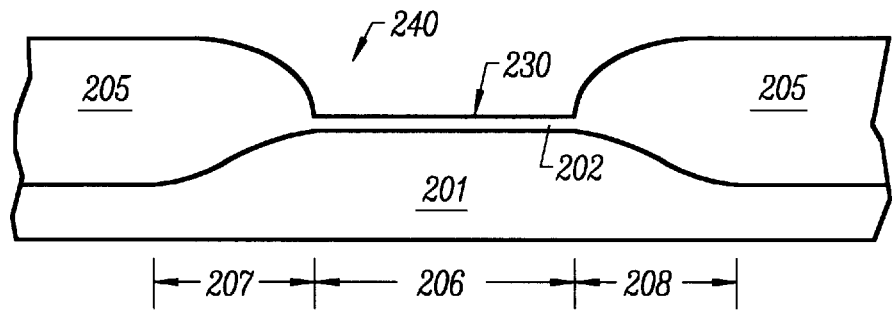
Figure 2E:
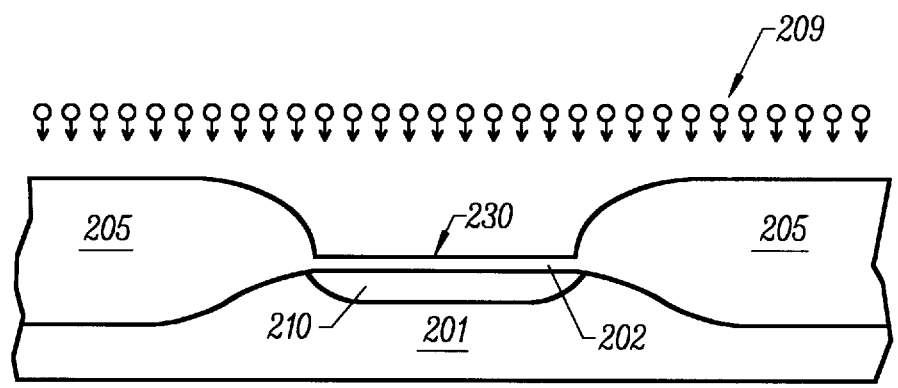
Figure 2F:
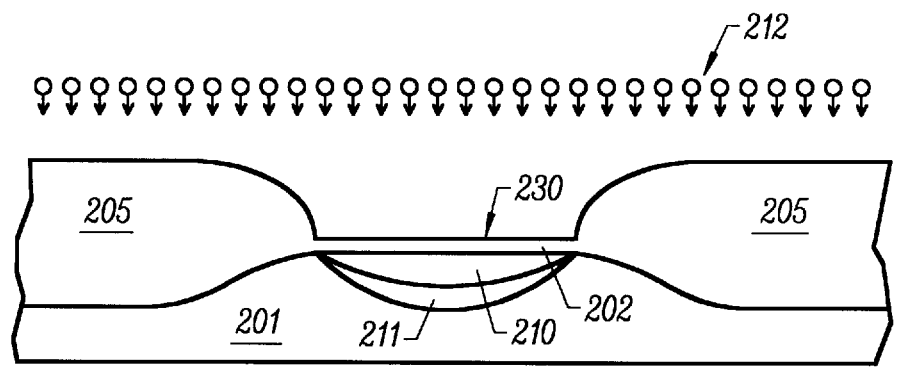
Figure 2G:
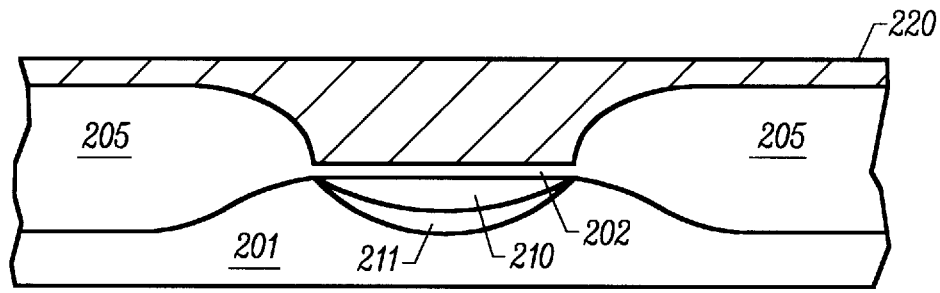
Figure 2H:
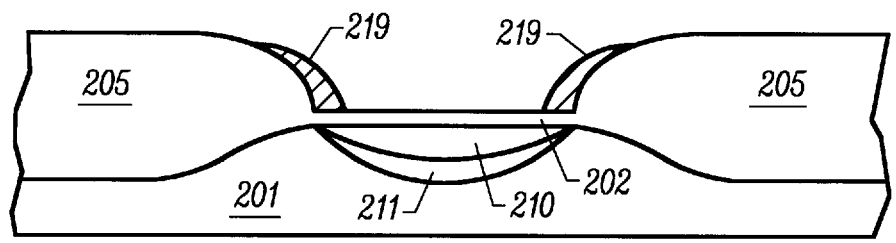
Figure 2I:
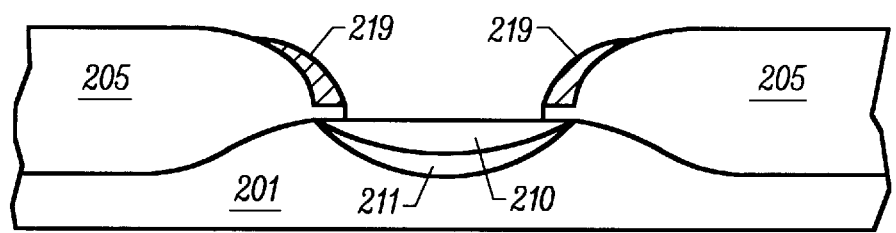
Figure 2J:
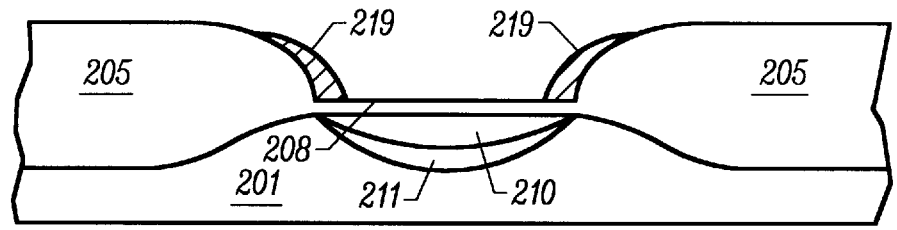
Figure 2K:
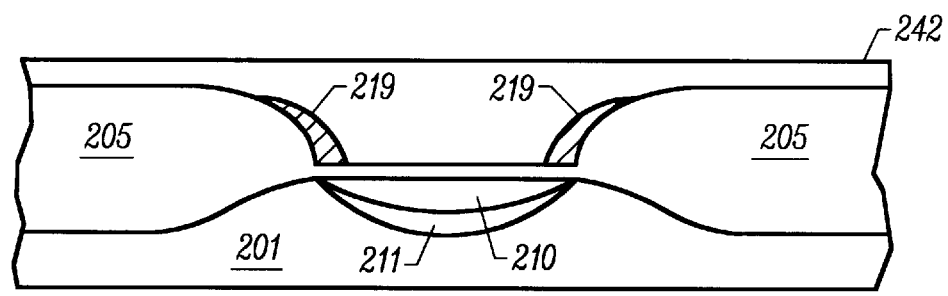
Figure 2L:
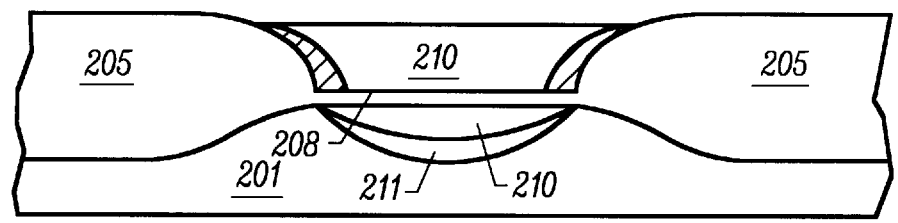
Figure 2M:
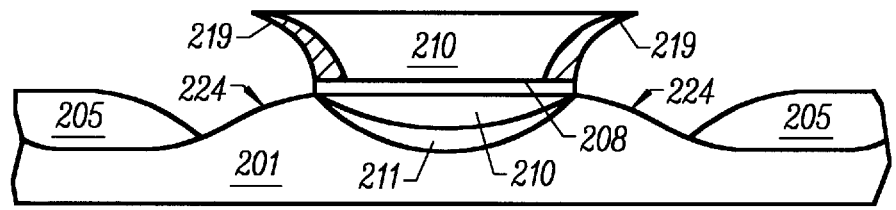
Figure 2N:
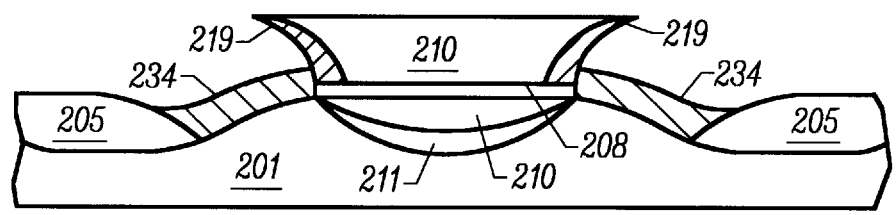
Figure 2O:
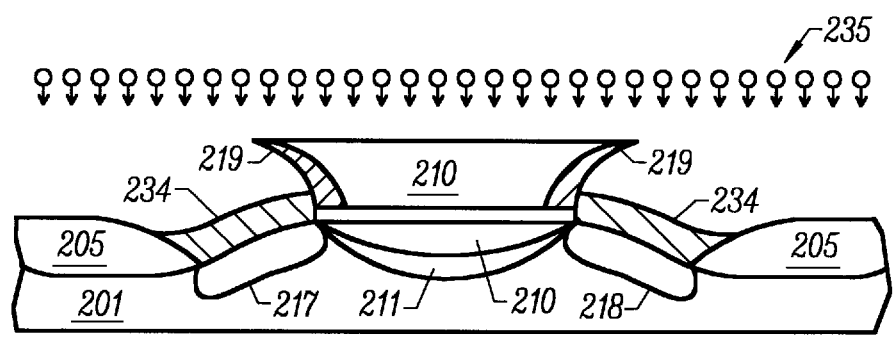
Figure 2P:
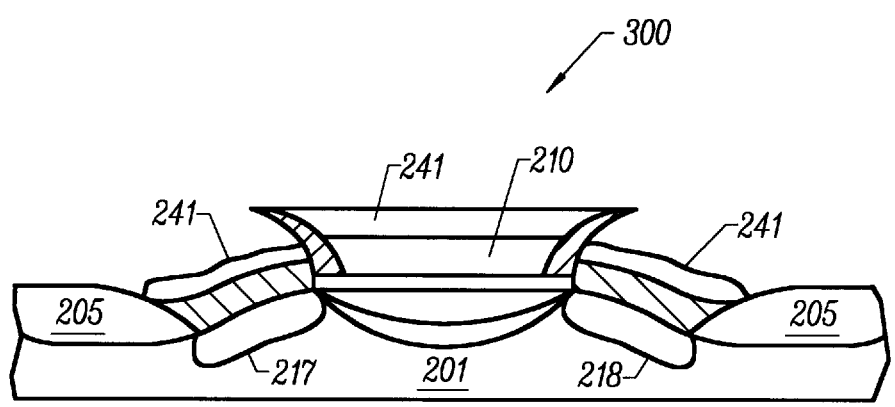

FIGS. 2(a)–2(p) illustrate the steps in a process for manufacturing a transistor 300 (FIG. 2(p)) in accordance with the present invention. This process provides for the formation of the transistor's gate without the use of photolithography to pattern the gate.

The first step in constructing a transistor in accordance with the present invention is to form a gate structure cavity to house the transistor's gate structure. The gate structure, as will be described in greater detail below, includes a gate and spacer, which surrounds the perimeter of the gate. Alternatively, the gate structure may consist of only a gate.

FIG. 2(a) shows a substrate 201, such as a semiconductor wafer made from silicon or another semiconductor material. A insulative layer of material 202, such as silicon dioxide ($SiO_2$), is grown on top of the substrate 201 using a conventional oxidation procedure. The thin insulative layer of material 202 operates as a pad oxide to prevent the formation of stress dependent defects during subsequent oxidation. The pad oxide has a thickness in the range of 5 nanometers ("nm") to 20 nm.

A layer of a nitride material 203, such as silicon nitride ($Si_3N_4$), is deposited on top of the pad oxide 202. The layer of nitride 203 is deposited using standard deposition procedures, such as low pressure chemical vapor deposition. The nitride 203 layer's thickness is in a range of 20 nm to 150 nm.

The layer of nitride 203 is patterned, as shown in FIG. 2(b), to form a gate template structure 204. The gate template structure has a gate structure length ($L_g$) that is substantially equal to the base of the gate structure for the transistor that is being formed. In embodiments of the present invention, the gate structure length is in a range of 0.18 micrometers ("$\mu$m") to 0.38 $\mu$m.

The layer of nitride 203 is patterned to form the gate template structure 204 by using conventional photolithography. A layer of photoresist is deposited over the nitride 203 and patterned using a photomask to only overlie a portion of the nitride 203 that will form the gate template structure 204. The exposed silicon nitride 203 is then etched. In one embodiment of the present invention, this etching is carried out in a reactive ion etching plasma reactor. Once the etching of the nitride 203 is completed, the photoresist is stripped away to expose the gate template structure 204.

In accordance with the present invention, a field oxide 205 is grown, once the gate template structure 204 is formed. The field oxide 205 isolates the transistor 300 from other circuits that are formed on the substrate 201. The field oxide 205, which is shown in FIG. 2(c), has a thickness in the range of 0.6 $\mu$m to 1.0 $\mu$m at its thickest point. In one embodiment of the present invention, the field oxide 205 is silicon dioxide.

A field oxide 205 is formed through a conventional oxidation process that provides for the growth of oxide from the pad oxide 202 on all sides of the gate template structure 204. The field oxide 205 growth is achieved by exposing the pad oxide 202 to oxygen ($O_2$) and infusing the oxygen with energy. The energy can be provided by heating the wafer on which the substrate 101 is located. In one embodiment of the present invention, the wafer is heated to a temperature in a range of 1050°–1125° C.

The field oxide 205 grows outward from the pad oxide 202 to extend both above the existing pad oxide 202 and into the substrate 201. As a result, the substrate's surface 224 takes on a convex shape within a region of the substrate 201 in which a transistor is to be formed. As shown in FIG. 2(c), regions of the substrate surface 224 extending outward from the gate template structure 204 slope downwardly.

Once the field oxide 205 has been formed, the gate template structure 204 is removed, as shown in FIG. 2(d). The removal of the gate template structure 204 results in the formation of the gate structure cavity 240 that extends upward from the pad oxide 202 through the field oxide 205. The surrounding field oxide forms the sidewalls of the gate structure cavity 240. At the base of the gate structure cavity 240 is a mask window 230. The mask window 230 extends between the boundaries of the field oxide 205 and includes the portion of the pad oxide 202 that was previously covered by the gate template structure 204.

The gate template structure 204 may be removed through a conventional maskless etching process that does not employ photolithography. When photolithography is not employed, the etching that is performed is referred to as maskless etching, because no photomask is used. The maskless etching process for removing the gate template structure 204 provides for the decomposition of the nitride 203 and does not etch either the pad oxide 202 or the field oxide 205. Hot phosphoric acid having a temperature of approximately 180° C. may be employed as the etchant.

The gate structure cavity 240 formed by the field oxide 205 and pad oxide 202 provides a channel for introducing dopant impurities into the substrate region 206 that underlies the mask window 230. This is useful for introducing dopants into substrate region 206 to set the threshold voltage and punch-through breakdown voltage for the transistor. The field oxide 205 surrounding the gate structure cavity 240 acts as a shield to impede the introduction of dopant impurities into the regions of the substrate 201 that are juxtaposition substrate region 206. As will be shown below, the transistor's gate structure will be formed over substrate region 206, which will be referred to as the gate structure region 206.

Figure 1A:
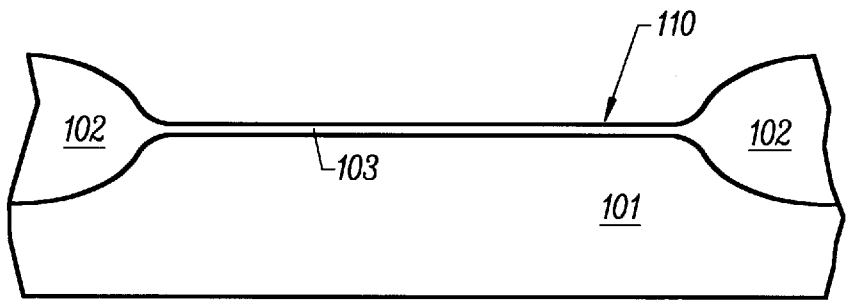
FIGS. 1(a)–1(g) illustrate a cross-sectional view of a traditional process for forming a transistor.
Figure 1B:
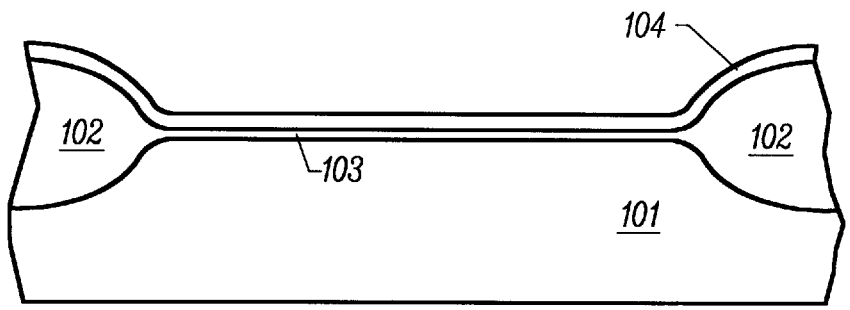
Figure 1C:
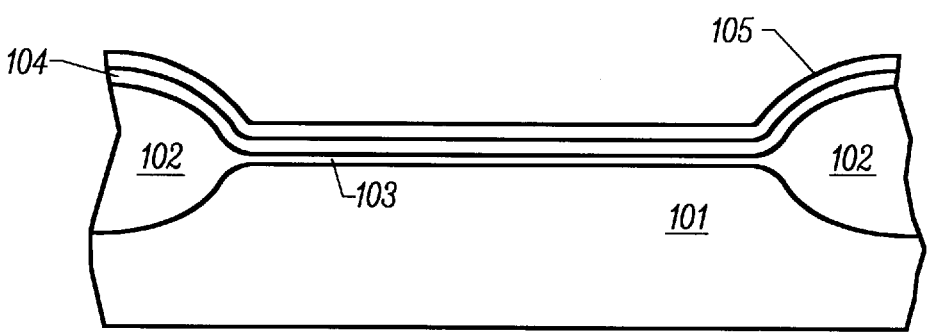
Figure 1D:
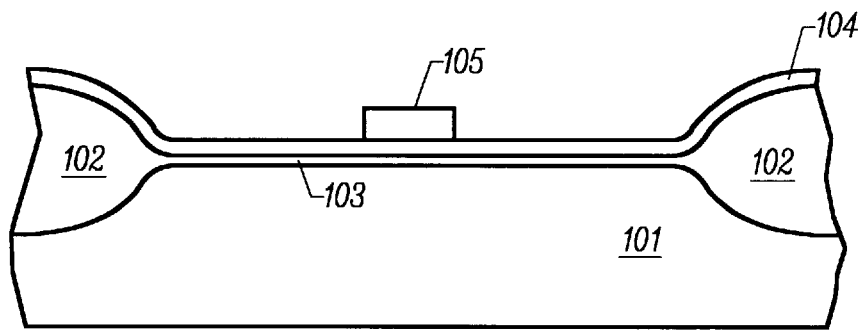
Figure 1E:
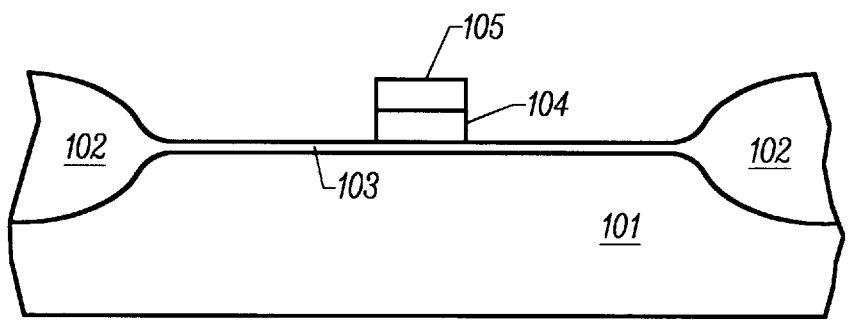
Figure 1F:
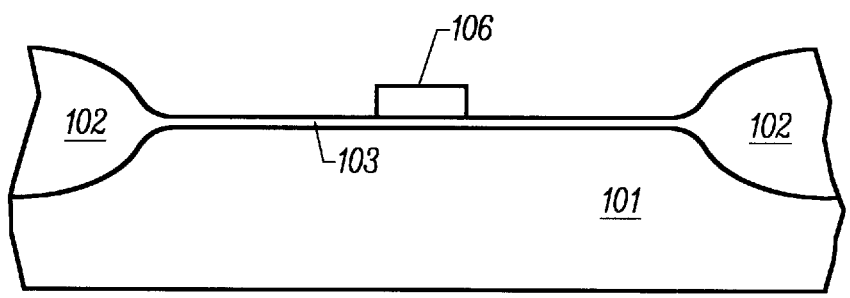
Figure 1G:
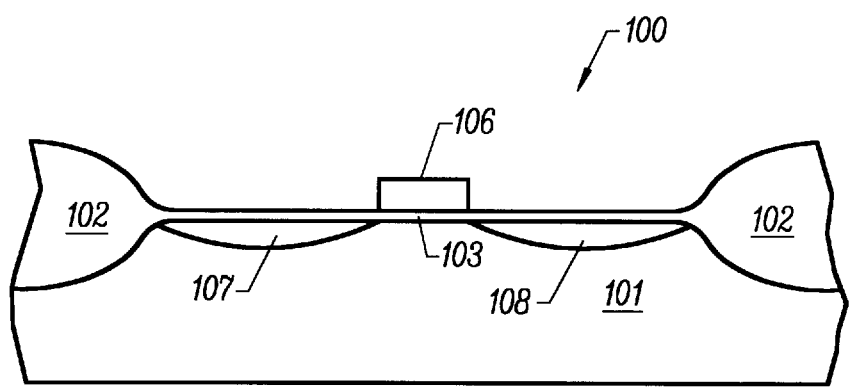

As discussed above, the presence of the gate template structure during field oxidation provides for the substrate's upper surface 224 overlying substrate regions 207 and 208 to have a convex topology. As will be shown below, the source and drain for the transistor are formed in substrate regions 207 and 208, respectively. The convex substrate surface 224 topology overlying the source and drain provides for the transistor 300 to have a higher avalanche breakdown voltage than a traditional transistor. As shown in FIG. 1(g), a traditional transistor has its source 107 and drain 108 formed beneath a substantially planar substrate upper surface topology.

In traditional processes for forming a transistor, a gate template structure 204 is not formed. Instead, a layer of nitride overlying a substrate is patterned using photolithography to have a length that spans substantially the entire surface region of a substrate underneath which a transistor will be formed. A traditional field oxide is then formed around the sides of the conventionally patterned nitride, and the nitride is removed. As a result, a planar surface of the substrate is exposed to serve as the region in which the entire transistor will be formed. For example, in the transistor shown in FIGS. 1(a)–1(g), a traditional planar substrate surface 110 (FIG. 1(a)) is formed. As shown in FIGS. 1(a) and 1(g), this planar region 110 extends for substantially the entire length of the source 107, gate 106, and drain 108 of the transistor 100.

Once the gate structure cavity 240 is formed, the threshold voltage and punch-through breakdown voltage for the transistor are set. This is achieved in accordance with the present invention by introducing dopant impurities into the gate structure region 206 of the substrate 101 through the mask window 230. One set of impurities is introduced to set the threshold voltage, and another set of impurities is introduced to set the punch-through breakdown voltage.

As shown in FIG. 2(e), an ion implantation procedure may be employed to introduce threshold voltage impurities 209 into the substrate 201. In the ion implantation procedure, ions 209 are accelerated into the gate structure cavity 240 and surrounding field oxide 205. The thickness of the field oxide 205 prevents the accelerated ions 209 from reaching the substrate 201. The mask window 230 at the base of the gate structure cavity 240 allows the accelerated ions 209 to penetrate into substrate region 206 beneath the mask window 230 to form a first doped region 210. The first doped region 210 extends laterally to span approximately the length of the mask window 230. The first doped region also extends below the upper surface of the substrate 201 a distance in the range of 0.05 $\mu$m to 0.08 $\mu$m.

When a n-channel transistor is being formed in accordance with the present invention, a p-type impurity, such as boron, indium, or boron diflouride ($BF_2$), is implanted. The ion implantation may be performed at an energy range of 10–120 kilo-electron volts (KeV) and $1e^{12}$–$1e^{13}$ atoms per square centimeter ($cm^{-2}$). When a p-channel transistor is being formed in accordance with the present invention, an n-type impurity, such as phosphorus, arsenic or antimonium, is implanted. The ion implantation may be performed at an energy range of 100–250 KeV and $1e10^{12}$–$1e10^{13}$ atoms $cm^{-2}$.

After the first doped region 210 is completed, a second doped region 211 is formed in the substrate 201 to establish a punch-through breakdown voltage for the transistor. Another set of ions is introduced into the substrate region 206 beneath the mask window 230 to form the second doped region 211. As shown in FIG. 2(f), an ion implantation procedure may be employed to introduce punch-through breakdown voltage impurity ions 212 into the substrate 201. As described above with reference to FIG. 2(e), the thickness of the field oxide 205 prevents the accelerated ions from reaching the substrate 201 regions beneath the field oxide 205. The mask window 230 allows the accelerated ions 212 to penetrate into the substrate's gate structure region 206 to form the second doped region 211. The second doped region 211 also extends laterally to span approximately the length of the mask window 230 and extends below the surface of the substrate 201 a distance in the range of 0.10 $\mu$m to 0.30 $\mu$m.

When a n-channel transistor is being formed in accordance with the present invention, a p-type impurity, such as boron, is implanted to form region 211. The ion implantation may be performed at an energy range of 50–250 KeV and $1e10^{12}$–$1e10^{13}$ atoms $cm^{-2}$. When a p-channel transistor is being formed in accordance with the present invention, a n-type impurity, such as arsenic or phosphorous, is implanted. The ion implantation may be performed at an energy range of 150–1500 KeV and $1e10^{12}$–$1e10^{13}$ atoms $cm^{-2}$.

Once the impurities for the threshold voltage and punch-through breakdown voltage are introduced into the substrate 101, a gate structure is formed in the gate structure cavity 240. In one embodiment of the invention, the gate structure includes both a gate and a spacer to set the width of the gate. In alternate embodiments of the present invention, the gate fills the entirety of the gate structure cavity 240.

When forming the spacer, as shown in FIG. 2(g), a layer of a spacer material 220, such as a nitride or oxynitride, is deposited on the upper surfaces of the field oxide 205 and pad oxide 202. The deposition of the spacer material is carried out using conventional deposition processes, such as the one described above with reference to the nitride 203 shown in FIG. 2(a). In accordance with the present invention, the spacer material 220 is deposited to have a thickness in the range of 50 nm to 100 nm. In one embodiment of the present invention, the spacer material 220 is silicon nitride ($Si_3N_4$).

Once the spacer material 220 is deposited, it is masklessly etched to form the spacer 219. As shown in FIG. 2(h), an anisotropic maskless etch is performed to remove the spacer material 220 from the majority of the upper surface of the mask window 230 and the upper surface of the field oxide 205 extending outside of the gate structure cavity 240. As a result, a spacer 219 is formed on the sidewalls of the gate structure cavity 240. The spacer 219 extends upward from the mask window 230 and outward from the sidewalls of the gate structure cavity 240.

The distance that the spacer 219 extends outward from the sidewalls of the gate structure cavity 240 sets the length of the gate for the transistor. The extension of the spacer 219 defines a lightly doped drain extension for the transistor, since the spacer 219 will block some of the implants used to form the transistor's source and drain, as will be described in greater detail below. In one embodiment of the present invention, the spacer 219 extends outward from the sidewalls of the gate structure cavity 240 a distance in the range of 5 nm to 20 nm. The anisotropic etching of the spacer material 220 is carried out using conventional etching processes that provide for the decomposition of the spacer material 220 but do not etch either the pad oxide 202 or field oxide 205.

Once the spacer 219 is formed, as shown in FIG. 2(h), pad oxide 202 is removed, so that a gate oxide may be grown on the substrate 201. The gate oxide is grown to underlie a gate that is to be placed in the gate structure cavity 240. In order to remove the pad oxide 202 in one embodiment of the present invention, as shown in FIG. 2(i), a maskless wet etching process is employed. In the wet etching process, an etchant is employed that provides for the etching of oxides but not the spacer 219. In an alternate embodiment of the present invention, a combination of dry and wet etching is used to remove the pad oxide 202. As a result of the etching, the pad oxide 202 is removed to expose the surface of the underlying substrate 201, and the thickness of the field oxide 205 is decreased in the range of 10 nm to 20 nm.

After removing the pad oxide 202, a gate oxide 208 is grown on the exposed upper surface of the substrate 201. The gate oxide 208, which is shown in FIG. 2(j), is grown using conventional thermal oxidation techniques. As a result, a thin layer of oxide is grown on the exposed upper surface of the substrate 201 and the upper surface of the field oxide 205. The thickness of the gate oxide 208 and increase in the field oxide 205 thickness is in a range of 1.5 nm to 4.5 nm. In accordance with the present invention, the gate oxide 208 is composed of either silicon dioxide, silicon oxide or silicon oxynitride. The upper surface of the gate oxide 208 extends between the boundaries of the spacer 219 in the gate structure cavity 240 to replace the pad oxide 202 that was previously removed.

Once the gate oxide 208 is in place, a gate is formed for the transistor. The gate is formed to reside within the gate structure cavity 240. The base of the gate overlies the region of the substrate 101 that is beneath the mask window 230 and is not overlied by the spacer 219. In order to form that gate, a layer of conductive material 242, such as polysilicon, is deposited on the upper surface of the field oxide 205 and within the portion of the gate structure cavity 240 that is not filled by the spacer 219. The deposited layer of conductive material 242 is shown in FIG. 2(k). The layer of conductive material 242 can be deposited by a number of different conventional procedures, such as low pressure chemical vapor deposition.

Next, the layer of conductive material 242 is polished, as shown in FIG. 2(l). As a result of the polishing, the conductive material 242 is removed from the upper surface of the field oxide 205 and the portion of the spacer 219 which is on substantially the same plane as the upper surface of the field oxide 205. The gate structure cavity 240 has its volume filled with the spacer 219 and the conductive material 242 that is not removed by the polishing. The conductive material 242 that remains in the gate structure cavity 240 after the polishing is the gate 210 for the transistor. In one embodiment of the present invention, chemical mechanical polishing is employed to polish the layer of conductive material 242 to form the transistor's gate 210.

After the gate 210 is constructed, the source and drain for the transistor are formed. The first step in forming the source and drain is to masklessly etch the field oxide 205, as shown in FIG. 2(m). In one embodiment of the present invention, a wet etch is performed to isotropically etch the field oxide 205, so that portions of the upper surface 224 of the substrate 201 are exposed for introducing ions into the substrate 201. When performing the etch, an etchant is selected that will etch the field oxide 205 but neither the gate 210, substrate 101 nor spacer 219.

In one embodiment of the present invention, the etchant is hydroflouric acid combined with ammonia, fluoride and water. This element will etch away the oxide but not the material that composes either the substrate 201, spacer 219, or gate 210. In such an embodiment, the etch is performed for a time in a range of 1 minute to 20 minutes.

As a result of the maskless etch, the field oxide 205 is reduced by approximately 0.20 $\mu$m to 0.30 $\mu$m so that the field oxide 205 has a thickness in a range of 0.40 $\mu$m to 0.50 $\mu$m at its thickest point. The oxide that underlies the gate structure, including the spacer 219 and gate 210, remains intact and is not degraded by the etch. The portions of the substrate's upper surface 224 that extend between the oxide beneath the gate structure and the remaining field oxide 205 are exposed for ion introduction. The exposed portions of the substrate's upper surface 224 are also the portions of the substrate's upper surface 224 that have a convex topology. The source and drain for the transistor will be formed beneath these convex portions of the substrates's upper surface 224.

In an alternate embodiment of the present invention, the above-described isotropic wet etch of the field oxide 205 is performed to reduce the thickness of the field oxide 205 by approximately 0.20 $\mu$m to 0.25 $\mu$m. The wet etch is then followed by a standard anisotropic dry oxide etch. The anisotropic dry oxide etch is only performed for a brief period of time to expose the convex portions of the substrate's upper surface 224 that are to overlie the source and drain for the transistor. The dry oxide etch also trims sharp corners of the spacer 219.

Once the etching of the field oxide 205 is completed, selective silicon epitaxy is performed. As shown in FIG. 2(n), a thin layer of epitaxial silicon 234 is grown on the upper surfaces of the exposed portions of the substrate 201. The epitaxial silicon overlying the substrate 201 also extends laterally over a small portion of the field oxide 205. The epitaxial silicon 234 is grown using a conventional process for selectively growing epitaxial silicon and has a thickness in a range of 0.050 $\mu$m to 0.075 $\mu$m.

Next, dopant impurities 235 are introduced into the substrate 201 to form the transistor's source and drain. In one embodiment of the present invention, the impurities are introduced using an ion implantation procedure followed by thermal annealing.

FIG. 2(o) illustrates the ion implantation and annealing that is used to introduce impurities for forming the source 217 and drain 218. First, impurity ions 235 are accelerated into the upper surface of the partially formed integrated circuit on the wafer. Once the acceleration of ions 235 is completed, the wafer is annealed to diffuse the ions 235 further into the substrate 201 to form the source 217 and drain 218. The field oxide 205 and gate structure, including the gate 210 and spacer 219, each shield their respective underlying substrate 201 regions from being implanted with ions 235. The ions 235 being introduced into the epitaxial silicon 234 become embedded in the epitaxial silicon 234 by the ion implantation and diffused into the underlying substrate 201 by the thermal annealing to form the source 217 and drain 218.

The source 217 and drain 218 each extend laterally from the base of the gate structure to the boundary of the field oxide 205. In embodiments of the present invention, portions of the source 217 and drain 218 can undercut the gate structure and field oxide 205 as a result of the implanted and annealed ions 235 diffusing within the substrate 201 once they are introduced. The source 217 and drain 218 each extend below the convex portion of the substrate's upper surface 224 for a distance between 0.06 $\mu$m to 0.10 $\mu$m.

When a n-channel transistor is being formed in accordance with the present invention, a n-type impurity, such as phosphorous or arsenic, serves as the source/drain impurity 235. In one embodiment of the present invention, the ion implantation is performed at an energy range of 5–25 KeV and $1e10^{15}$–$5e10^{15}$ atoms cm$^{-2}$. This results in the majority of the ions 235 being embedded within the epitaxial silicon 234 that overlies the substrate 101.

When a p-channel transistor is being formed in accordance with the present invention, a p-type impurity, such as boron, is introduced. In one embodiment of the present invention, the ion implantation is performed at an energy range of 2.5–15 KeV and $1e10^{15}$–$5e10^{15}$ atoms cm$^{-2}$. This also results in the majority of the ions 235 being embedded within the epitaxial silicon 234 that overlies the substrate 201.

In one embodiment of the present invention, the thermal annealing is achieved by employing traditional rapid thermal processing ("RTP"). Using RTP, the temperature of the partially formed transistor is set to be in a range of 950° C. to 1050° C. for a time in a range of 30 to 60 seconds. As a result of the rapid thermal processing, the impurity ions 235 are further diffused so that the source 217 and drain 218 each extend below the convex upper surface of the substrate 224 for a distance in a range of 0.05 $\mu$m to 0.15 $\mu$m.

As shown in FIGS. 2(g)–2(o), the gate 210, source 217, and drain 218 for the transistor have been formed in a convex substrate region without the use of photolithography to pattern a gate in a layer of material. This contrasts with the traditional formation of a transistor, as shown in FIGS. 1(a)–1(g), which requires the use of photolithography to pattern the transistor's gate 106. Accordingly, a transistor can be formed in accordance with the present invention without incurring the full extent of traditional photolithography costs.

Once the source 217 and drain 218 are established, a salicidation process is performed to provide a silicide layer of material on the upper surfaces of the gate 210, source 217, and drain 218. The silicide provides for making a good ohmic contact with plugs, electrodes, and diffusion barriers that are employed in coupling the transistor's gate 210, source 217, and drain 218 to metal lines and other circuit elements.

As shown in FIG. 2(p), a refractory metal 241, such as titanium, tungsten, tantalum, and molybdenum, or cobalt is deposited and patterned on the upper surface of the gate 210 and the upper surfaces of the epitaxial silicon 234 overlying the transistor's source 217 and drain 218. The deposition of the refractory metal 241 can be achieved through traditional deposition processes such as physical vapor deposition. The patterning of the refractory metal 241 can be achieved through the use of a traditional photolithography process.

In order to complete the salicidation, the refractory metal 241 is alloyed with the underlying gate 210 and layer of epitaxial silicon 234. When performing the alloying, the refractory metal and underlying epitaxial silicon 234 are heated to a temperature in the range of 600° C. to 800° C. for a time period in the range of 30 to 60 seconds. This causes an interdiffusion of the refractory metal and underlying silicon that results in a good ohmic contact being formed between the refractory metal and underlying silicon. As a result of the salicidation, a refractory metal silicide is formed which has a lower contact resistance than the epitaxial silicon.

As shown in FIG. 2(p), the completed transistor is formed on a convex substrate surface with the base of the gate 210 being elevated above source 217 and drain 218. The gate structure resides above the highest region of the convex substrate surface and is separated from the substrate surface by the gate oxide 208. The gate structure extends laterally above the substrate surface until the substrate surface begins to slope downward. Underlying the downward sloping convex regions of the substrate surface are the source 217 and drain 218.

The convex shape of the substrate surface 224 results in the avalanche breakdown voltage of the transistor being in a range of 5 to 8 volts. This provides significant improvement over the avalanche breakdown voltage found in a traditional metal oxide semiconductor transistor which is formed without using a gate template structure to construct a gate structure cavity. The planar substrate surface in a traditional transistor, such as the transistor shown in FIGS. 1(a)–1(g), results in the traditional transistor having an avalanche breakdown voltage in the less favorable range of 3 to 5 volts.

Although the invention has been described above with particularity, this was merely to teach one of ordinary skill in the art how to make and use the invention. Many modifications will fall within the scope of the invention, as that scope is defined by the following claims.

What is claimed is:

1. A method for forming a transistor on a substrate, said method comprising the steps of:
   (a) forming an insulative layer of material on said substrate;
   (b) forming a gate template structure on top of said insulative layer of material, wherein said gate template structure has a length that is substantially equal to the narrowest length of a gate structure for the transistor, wherein said gate template structure resides over a region of said substrate which will be overlaid by said gate structure;
   (c) growing a field oxide from said insulative layer of material, wherein said field oxide extends outward from said gate template structure and upward from said insulative layer of material;
   (d) removing said gate template structure to form a gate structure cavity that extends through said field oxide, wherein said gate structure cavity is defined by cavity sidewalls and a base, wherein said base is a mask window portion of said insulative layer of material; and
   (e) masklessly forming said gate structure in said gate structure cavity.

2. The method of claim 1, wherein said step (e) includes the steps of:
   depositing a conductive material on an upper surface of said field oxide and in said gate structure cavity; and
   polishing said conductive material to form a gate.

3. The method of claim 2, wherein said conductive material is polysilicon.

4. The method of claim 2, wherein said step of polishing is performed using chemical mechanical polishing.

5. The method of claim 2, wherein said step (e) further includes the steps of:
   etching a portion of said insulative layer of material forming said mask window to expose a portion of said substrate, prior to performing said step of depositing said conductive material; and
   growing a gate oxide from said exposed portion of said substrate, prior to said step of depositing said conductive material.

6. The method of claim 5, wherein said gate oxide is silicon dioxide having a thickness in a range of 1.5 nm to 4.5 nm.

7. The method of claim 5, wherein said step (e) further includes the step of:
   forming a spacer in said gate structure cavity, prior to performing said step of depositing said conductive material, wherein said spacer separates said conductive material from said cavity sidewalls.

8. The method of claim 7, wherein said step of forming said spacer includes the steps of:
   depositing a spacer material on an upper surface of said field oxide and an outer surface of said gate structure cavity; and
   masklessly etching said spacer material.

9. The method of claim 8, wherein said spacer material is deposited to have a thickness is a range of 50 nm to 100 nm.

10. The method of claim 9, wherein said spacer material is a material selected from the group consisting of nitride, oxynitride, and silicon nitride.

11. The method of claim 1, wherein said insulative layer of material is a pad oxide.

12. The method of claim 11, wherein said pad oxide is silicon dioxide.

13. The method of claim 1, wherein said field oxide has a thickness in a range of 0.60 μm to 1.0 μm.

14. The method of claim 13, wherein said field oxide is silicon dioxide.

15. The method of claim 1, wherein said gate template structure has a length in a range of 0.18 μm to 0.38 μm.

16. The method of claim 1, wherein said gate template structure has a thickness in a range of 20 μm to 150 nm.

17. The method of claim 1, wherein said method further includes the step of:

(f) forming a source and a drain for said transistor.

18. The method of claim 17, wherein said step (f) includes the step of:

masklessly etching said field oxide to expose a first upper surface overlying a first region of said substrate and a second upper surface overlying a second region of said substrate.

19. The method of claim 18, wherein said step of masklessly etching said field oxide causes said field oxide to have a thickness in a range of 0.40 μm to 0.50 μm.

20. The method of claim 19, wherein said step (f) further includes the steps of:

growing a layer of epitaxial silicon on said first upper surface and said second upper surface; and introducing a set of ions into said first region of said substrate and said second region of said substrate to form a source in said first region of said substrate and a drain in said second region of said substrate.

21. The method of claim 20, wherein said first upper surface extends outward and downward from a first side of said gate structure and said second upper surface extends outward and downward from a second side of said gate structure.

22. The method of claim 20, wherein said step of introducing said set of ions includes the steps of:

implanting said set of ions into said layer of epitaxial silicon overlying said first upper surface and said second upper surface; and annealing said substrate.

23. The method of claim 22, wherein said annealing is performed at a temperature in a range of 950° C. to 1050° C. for a time period in a range of 30 seconds to 60 seconds.

24. The method of claim 1, further including the step of:

(g) following said step (d) and prior to performing said step (e) introducing ions into said substrate through said mask window portion of said insulative layer of material.

25. The method of claim 24, wherein said step (g) includes the steps of:

implanting a first set of ions into said substrate through said mask window portion of said insulative layer of material.

26. The method of claim 25, wherein said first set of ions establishes a threshold voltage for the transistor.

27. The method of claim 24, wherein said step (g) further includes the step of:

implanting a second set of ions into said substrate through said mask window portion of said insulative layer of material.

28. The method of claim 27, wherein said second set of ions establishes a punch-through breakdown voltage for the transistor.

29. A method for forming a transistor on a substrate, said method comprising the steps of:

(a) forming an insulative layer of material on the substrate;

(b) forming a gate template structure on top of said insulative layer of material, wherein said gate template structure has a length that is substantially equal to the narrowest length of a gate structure for the transistor, wherein said gate template structure resides over a region of said substrate which will be overlaid by said gate structure;

(c) growing a field oxide from said insulative layer of material, wherein said field oxide extends outward from said gate template structure and upward from said insulative layer of material;

(d) removing said gate template structure to form a gate structure cavity that extends through said field oxide, wherein said gate structure cavity is defined by cavity sidewalls and a base, wherein said base is a mask window portion of said insulative layer of material;

(e) introducing ions into said substrate through said mask window portion of said insulative layer of material;

(f) depositing a spacer material on an upper surface of said field oxide, said cavity sidewalls, and said mask window;

(g) masklessly etching said spacer material;

(h) masklessly etching a portion of said insulative layer of material forming said mask window to expose a portion of said substrate;

(i) growing a gate oxide from said exposed portion of said substrate;

(j) following said step of growing said gate oxide, depositing a conductive material on an upper surface of said field oxide and in said gate structure cavity; and (k) polishing said conductive material to form a gate.

30. The method of claim 29, wherein said field oxide extends into said substrate so as to cause a first portion of an upper surface of said substrate to extend convex downwardly and a second portion of said upper surface of said substrate to extend convex downwardly.

31. The method of claim 30, wherein said first portion of said upper surface of said substrate overlies a first region of said substrate in which a source for the transistor will be formed and said second portion of said upper surface of said substrate overlies a second region of said substrate in which a drain for the transistor will be formed.

32. The method of claim 31, wherein said method further includes the step of:

(l) forming a source and a drain for said transistor.

33. The method of claim 32, wherein said step (l) includes the step of:

masklessly etching said field oxide to expose said first portion of said upper surface of said substrate and said second portion of said upper surface of said substrate.

34. The method of claim 33, wherein said step (l) further includes the steps of:

growing a layer of epitaxial silicon on said first portion of said upper surface and said second portion of said upper surface; and introducing a set of ions into said first region of said substrate and said second region of said substrate to form said source and said drain.

35. The method of claim 34, wherein said step of introducing said set of ions includes the steps of:

implanting said set of ions into said layer of epitaxial silicon overlying said first portion of said upper surface and said second portion of said upper surface; and annealing said substrate.

* * * * *

UNITED STATES PATENT AND TRADEMARK OFFICE
CERTIFICATE OF CORRECTION

PATENT NO. : 5,824,587
DATED : October 20, 1998
INVENTOR(S) : Zoran Krivokapic

It is certified that error appears in the above-indentified patent and that said Letters Patent is hereby corrected as shown below:

Column 5, line 32,  "$1e^{12}$-$1e^{13}$" should be -- $1\bullet10^{12}$-$1\bullet10^{13}$ --;

Column 5, line 37,  "$1e10^{12}$-$1e10^{13}$" should be -- $1\bullet10^{12}$-$1\bullet10^{13}$ --;

Column 5, line 61,  "$1e10^{12}$-$1e10^{13}$" should be -- $1\bullet10^{12}$-$1\bullet10^{13}$ --;

Column 5, line 65,  "$1e10^{12}$-$1e10^{13}$" should be -- $1\bullet10^{12}$-$1\bullet10^{13}$ --;

Column 8, line 48   "$1e10^{15}$-$5e10^{15}$" should be -- $1\bullet10^{15}$-$5\bullet10^{15}$ --;

Column 8, line 55   "$1e10^{15}$-$5e10^{15}$" should be -- $1\bullet10^{15}$-$5\bullet10^{15}$ --; and Column 11, line 8   "$20\mu m$" should be -- 20 nm--.

Signed and Sealed this

Eighth Day of June, 1999

Attest:

Q. TODD DICKINSON

*Attesting Officer*      *Acting Commissioner of Patents and Trademarks*